(12) United States Patent
Schneider et al.

(10) Patent No.: US 7,327,148 B2
(45) Date of Patent: Feb. 5, 2008

(54) METHOD FOR USING INTERNAL SEMICONDUCTOR JUNCTIONS TO AID IN NON-CONTACT TESTING

(75) Inventors: Myron J. Schneider, Ft. Collins, CO (US); Eddie Williamson, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/170,366

(22) Filed: Jun. 29, 2005

(65) Prior Publication Data

US 2007/0001687 A1  Jan. 4, 2007

(51) Int. Cl.
  *G01R 31/08* (2006.01)
  *G01R 27/26* (2006.01)
  *G01R 31/26* (2006.01)
(52) U.S. Cl. ............... 324/517; 324/686; 324/658; 324/765

(58) Field of Classification Search .............. 324/519, 324/617
See application file for complete search history.

(56) References Cited

U.S. PATENT DOCUMENTS

| | | | |
|---|---|---|---|
| 5,124,660 A | | 6/1992 | Cilingiroglu |
| 5,420,500 A | | 5/1995 | Kerschner |
| 5,498,964 A | * | 3/1996 | Kerschner et al. .......... 324/530 |
| 5,557,209 A | | 9/1996 | Crook et al. |
| 5,677,634 A | * | 10/1997 | Cooke et al. ............... 324/548 |
| 6,600,325 B2 | * | 7/2003 | Coates et al. ............... 324/519 |
| 6,828,815 B2 | * | 12/2004 | Ishida et al. ................ 324/765 |
| 6,975,978 B1 | * | 12/2005 | Ishida et al. .................. 703/15 |
| 2003/0016044 A1 | * | 1/2003 | Ishida et al. ................ 324/765 |
| 2005/0077911 A1 | * | 4/2005 | Miyasaka .................... 324/662 |

* cited by examiner

*Primary Examiner*—Jeff Natalini

(57) ABSTRACT

Capacitive leadframe testing techniques are improved through knowledge of characteristics of semiconductor junctions specific to nodes of device under test (DUT) that are connected to nodes under test of the DUT.

1 Claim, 9 Drawing Sheets

METHOD FOR USING INTERNAL SEMICONDUCTOR JUNCTIONS TO AID IN NON-CONTACT TESTING

BACKGROUND OF THE INVENTION

Capacitive lead-frame sensing technologies are typically used to detect opens between an integrated circuit (IC) signal pin and a mounting substrate (e.g., a printed circuit board). The amplitude of the alternating current (AC) stimulus is normally set to a level that ensures that semiconductor junctions, from which the functional circuitry of the integrated circuit is formed, do not turn on. The primary concern with turning on semiconductor junctions is damage to the IC device being tested due to excessive current.

When semiconductor junctions are turned on, the current supplied from the stimulus must be limited in magnitude and duration to prevent damage. The traditional semiconductor junction turns on at an AC stimulus of approximately 700 mV peak. Thus, the typical AC test stimulus for capacitive lead-frame technologies has been set around 200 mV, at which it is assumed that the junction current is insignificant to device damage and measurement stability.

Semiconductor junctions in newer technologies do not necessarily turn on at the traditional 700 mV due to advancements in semiconductor processing technology (shrinking geometries, changes in doping materials and doping concentrations, etc.) Furthermore, the knee at which these newer semiconductor junctions turn on is not necessarily a sharp transition at a single threshold voltage, but instead is a curve that could transit a significant voltage range. It is also common for a single IC to contain multiple groups of pins that have different junction characteristics.

Almost all pins on modern ICs include some level of protection for electrostatic discharge (ESD). ESD protection circuits commonly incorporate one or more diodes (semiconductor junctions) designed to turn on and discharge energy before any damage is done to internal circuitry. A simple example of traditional ESD protection circuitry is shown in FIG. 1 for an example circuit device, shown at 1, that includes at least one input 2 and one output 8. As shown, the input 2 receives a signal INPUT to be driven to internal circuitry 5. ESD protection on the input 2 includes a first pair of diodes 3, 4 (one 3 forward biased from ground to the input node 2, and the other 4 forward biased from the input node 2 to the power source $V_{cc}$), which protects the internal circuitry 5 connected to the input 2. ESD protection on the output 8 includes a second pair of diodes 6, 7 (one 6 forward biased from ground to the output 8, and the other 7 forward biased between from the output 8 to the power source $V_{cc}$), which protects the internal circuitry 5 connected to the output 8.

When one refers to a diode "turning on", one is usually referring to the voltage level (typically referred to as the "threshold voltage") at which the forward conducting current becomes significant. In reality, diodes conduct some current even before the knee at which the current becomes exponentially greater. FIG. 2 shows the traditional diode curve that might be exhibited by the circuit in FIG. 1. Assuming that only one diode is forward conducting at once and that the other conducts a minuscule reverse current, the circuit in FIG. 1 reduces to a simple diode and can be understood using the simplified diode equation:

$$i = I_o\left(e^{\frac{qV}{nkT}} - 1\right) \quad \text{Equation (1)}$$

where i is the diode current in amps, $I_o$ is the reverse saturation current in amps, q is the electron charge in coulombs, V is the diode voltage in volts, n is a dimensionless ideality factor, k is Boltzmann's constant, and T is the temperature in Kelvins.

As shown in FIG. 2, the circuit 1 in FIG. 1 has a recognizable forward conducting knee (shown at 15) of 700 mV at which the current is approximately 0.5 nA. The current at 200 mV (500 mV below the knee) is a mere 50 fA and unlikely to affect the capacitive lead-frame measurements.

The current-voltage (IV) curve of FIG. 2 is not necessarily representative of all semiconductor junctions in newer technologies. Moreover, not all newer technologies will use a simple protection circuit as shown in FIG. 1 because changing input/output (IO) standards may require protection of even lower voltage logic to higher energy levels.

An alternative circuit shown in FIG. 3 employs a two-stage approach to ESD protection of sensitive circuits. The behavior of the circuit in FIG. 3 cannot be modeled by Equation 1. Even though ESD protection circuits for newer technologies are not predictable, however, at the basic level they almost invariably consist of one or more semiconductor junctions that either explicitly or implicitly carry some of the same characteristics as a diode. One characteristic is a non-linear current-voltage (IV) curve similar in shape to the curve in FIG. 2 that results from the cumulative effects of the current through one or more junctions.

A second characteristic is a dependence of the current on temperature. Equation 1 explicitly includes temperature in the denominator of the exponential term. This would seem to imply that an increasing temperature causes a decrease in current for the diode (and thus any semiconductor junction with diode characteristics). The reality is normally the exact opposite because the reverse saturation component $I_o$ is also temperature dependent. The closer the applied voltage is to the forward conducting knee of the diode curve, the greater effect temperature will have on the current.

Capacitive lead-frame testing techniques rely on the ability of the tester to distinguish between very small differences in measured capacitance or measured current flow to allow the device tester to distinguish between the presence or non-presence of open, shorted, or otherwise defective joints of components of a device under test. Capacitive leadframe testing techniques are described in detail in U.S. Pat. No. 5,557,209 to Crook et al, U.S. Pat. No. 5,498,964 to Kerschner et al., U.S. Pat. No. 5,420,500 to Kerschner, U.S. Pat. No. 5,254,953 to Crook et al., and U.S. Pat. No. 5,124,660 to Cilingiroglu, all of which are hereby incorporated by reference for all that they teach. In the past, as described previously, the geometry of the junctions were such that the traditional semiconductor junctions were characterized by a single threshold voltage—that is, all semiconductor junctions on a given device under test could be relied to turn on at or within a margin of error of a single threshold voltage (typically at approximately 700 mV). During a capacitive leadframe test, therefore, this allowed the use of a single universal stimulus voltage level for stimulating all nodes under test of the device. The typical AC test stimulus voltage for capacitive lead-frame technologies has been set around 200 mV, at which it could be assumed that the junction current is sufficiently low to eliminate risk of damage to the device under test.

However, because advancements in semiconductor processing technology (shrinking geometries, changes in doping materials and doping concentrations, etc.) has lead to semiconductor junctions that turn on not at a single threshold voltage (or sharp knee), but rather semiconductor junctions that may be characterized by different junction characteristics relative to one another, and that turn on over a significant range of the stimulus voltage, the use of a single universal value of the stimulus voltage applied to all nodes under test of a device during a capacitive lead-frame test may be inappropriate, inefficient, or even problematic. It would therefore be desirable to utilize knowledge of the characteristics of the individual semiconductor junctions of nodes of components of a device under test to improve capacitive lead-frame testing of electrical devices even as the underlying semiconductor processing technology is changing.

SUMMARY OF THE INVENTION

The present invention is a technique for determining and utilizing knowledge of the characteristics of internal semiconductor junctions of electrical devices to improve software diagnostics in non-contact, capacitive lead-frame testing. In particular, the invention utilizes knowledge of the specific current-voltage (IV) relationship and/or capacitance-voltage (CV) relationship of component semiconductor junctions on component nodes of components connected to a device under test (DUT) to intelligently configure test parameters for nodes under test of the DUT. In addition, the invention utilizes knowledge of the specific characteristics of the component node(s) that are supposed to be connected to a node under test to assist in determining the presence or non-presence of a defect such as an open circuit on the node under test.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

The present invention is a technique for determining and utilizing knowledge of the characteristics of internal semiconductor junctions of electrical devices to improve software diagnostics in non-contact, capacitive lead-frame testing. In particular, the invention utilizes knowledge of the specific current-voltage (IV) relationship and/or capacitance-voltage (CV) relationship of component semiconductor junctions on component nodes of components connected to a device under test (DUT) to intelligently configure test parameters for nodes under test of the DUT. In addition, the invention utilizes knowledge of the specific characteristics of the component node(s) that are supposed to be connected to a node under test to assist in determining the presence or non-presence of a defect such as an open circuit on the node under test.

Figure 4A:
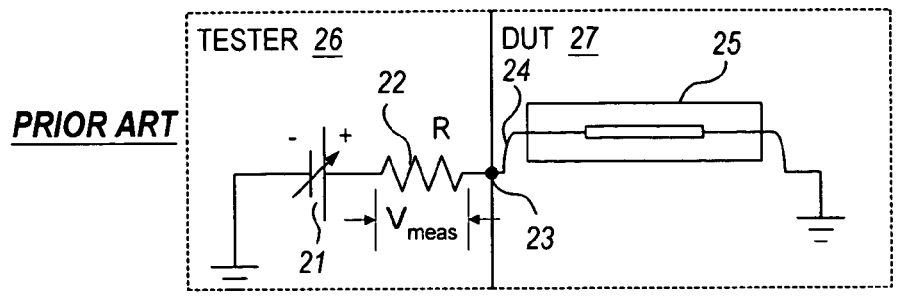
FIG. 4A is a schematic block diagram of a prior art circuit for measuring the current-voltage (IV) relationship of a node under test of a printed circuit board (PCB) that is connected to a pin of an integrated circuit component.
Figure 4B:
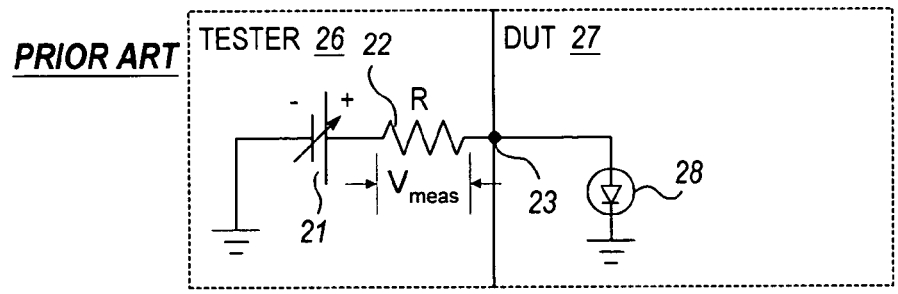
FIG. 4B is a schematic block diagram of the equivalent circuit of FIG. 4A.

Turning now to FIGS. 4A and 4B, the specific current-voltage (IV) relationship of a given pin 24 of an IC component 25 of a device under test (DUT) 27 is traditionally arrived at by inserting a small resistor R 22 in series between a test voltage source 21 and the node 23 connected to the component pin 24, for example as shown in the IC test setup circuit in FIG. 4A and its semiconductor junction 28 equivalent in FIG. 4B. The IV curve is derived from the voltage across the resistor R 22 as the voltage applied to the node under test 23 by the source 21 is swept through a range of values. The voltage sweep would stop whenever the forward conducting knee 15 had been reached or at a maximum safe current so as to avoid possible damage to the IC component 25.

Figure 1:
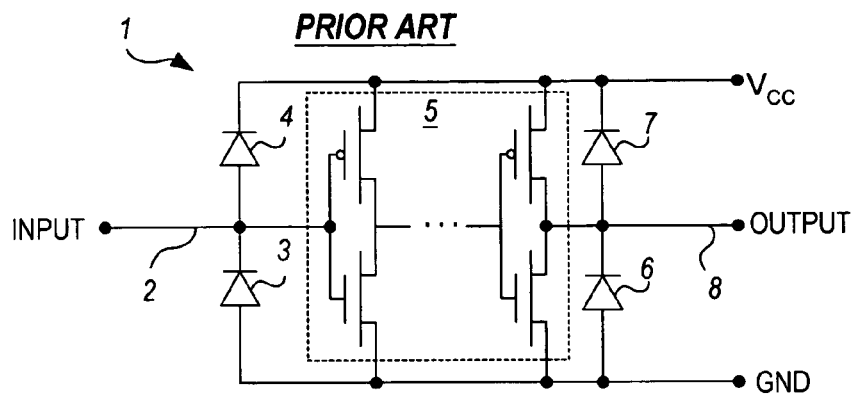
FIG. 1 is a schematic diagram of a prior art electronic device with electrostatic discharge (ESD) protection circuitry.

The circuits in FIGS. 4A and 4B have been simplified. It is understood that reverse-biased semiconductor junctions will exist as shown in FIG. 1 but they will have a negligible effect on measured current. It is further understood that a plurality of semiconductor junctions can be connected to the same node and therefore forward-biased simultaneously. The measured current will be the total current present across all of those junctions.

Figure 5A:
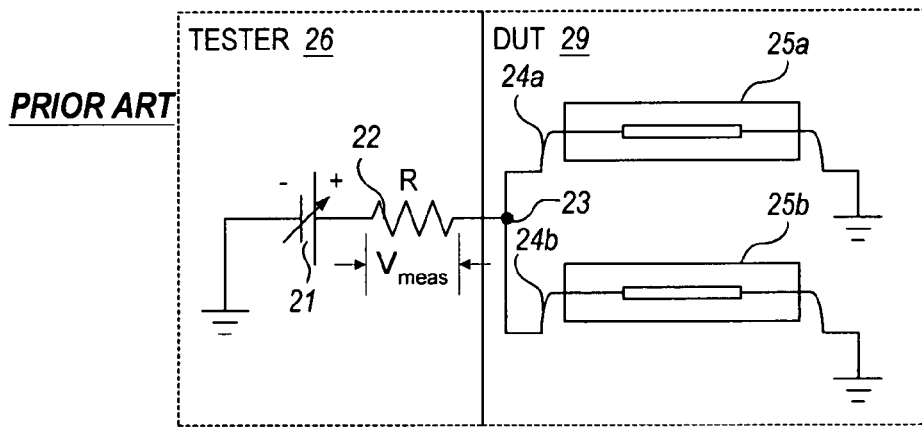
FIG. 5A is a schematic block diagram of a prior art circuit for measuring the current-voltage (IV) relationship of a node under test of a printed circuit board (PCB) that is connected to a pin of two different integrated circuit components.
Figure 5B:
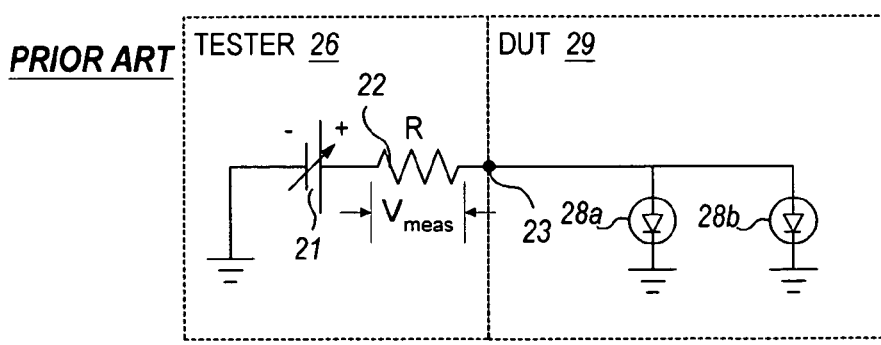
FIG. 5B is a schematic block diagram of the equivalent circuit of FIG. 5A.

Referring now to FIGS. 5A and 5B, it is not uncommon for two or more pins 24a, 24b from different IC components 25a, 25b to connect to the same node 23 on a device 29. The result on the measurement circuit of the tester 26 is to simply add more semiconductor junctions 28a, 28b whose total current is seen through the resistor R 22. FIGS. 5A and 5B show the measurement circuit for a device under test 29 with a plurality of pins 24a, 24b from different IC components 25a, 25b (two shown) connected to the same node 23. In this case, the IV curve arrived at through the traditional node stimulus method described above with respect to FIGS. 4A and 4B will be representative of all semiconductor junctions 28a, 28b attached to the tester node 23 (including all pins 24a, 24b from each component 25a, 25b that are attached to the tester node 23). This is an undesirable limitation because, since one of the semiconductor junctions 28a, 28b connected to the node 23 may dominate, and therefore hide the IV characteristics of, the other semiconductor junctions, the individual contributions of each component node attached to a given node under test cannot be determined from the cumulative IV curve resulting from the traditional method of determining the IV characteristics of a node under test.

Figure 6:
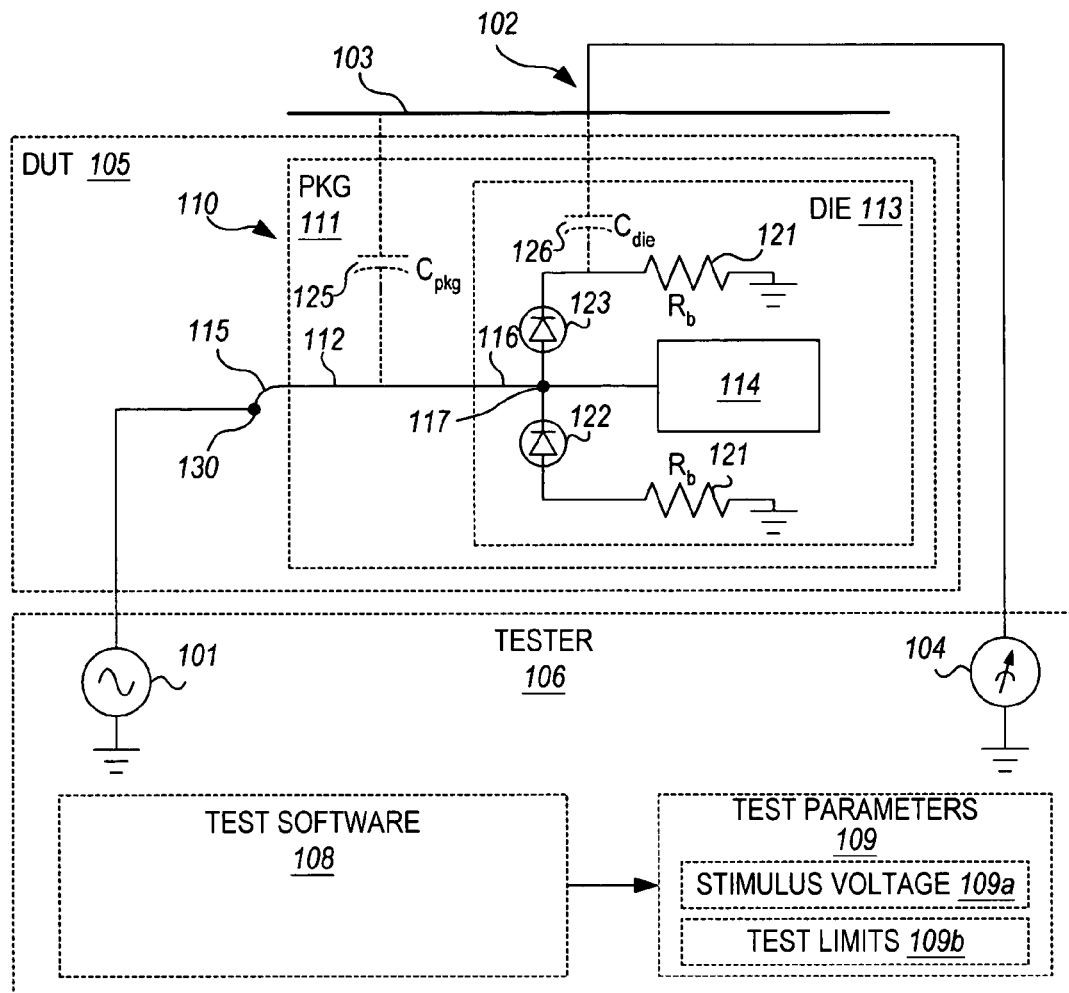
FIG. 6 is a schematic block diagram of a capacitive measurement system with a pair of ESD protection diodes as implemented in accordance with the invention.

This limitation is overcome through a novel extension of non-contact, capacitive lead-frame testing. The diagram of FIG. 6 shows a capacitive leadframe measurement system 100. The system 100 is configured to test an IC component 110 (e.g., an IC) of a device under test (DUT) 105 (e.g., a PCB). The IC component 110 includes circuitry 114 implemented on a die 113 that is protected at an internal input/output pad node 117 by ESD protection diodes 122, 123. Die node 117 is connected to a package leadframe 112 by a bondwire 116. The package leadframe 112 is connected to a package pin 115 of the IC component package 111, which is connected to a node under test 130 on the device under test 105 (i.e., the PCB).

A tester 106, for example an industrial in-circuit printed circuit board (PCB) tester, applies an alternating current (AC) stimulus voltage 101 to the node under test 130 on the DUT 105. The tester 106 is connected to a capacitive sensing probe 102 with a sensor plate 103 positioned on or in close proximity to the package 111 of the IC component 110 whose pin 115 is supposed to be connected to the node under test 130 of the DUT 105. A measurement device 104 measures current flow from the IC component to the sensing probe 102 due to capacitive coupling $C_{pkg}$ between the leadframe 112 of the package 111 and the sensor plate 103 of the sensing probe 102. Test software 108, which may be integrated into the tester 106 itself (as shown), or which may execute remotely on a remote computer system (not shown), processes the measurements as hereinafter described.

When the stimulus voltage 101 is small compared to the knee voltage of the diode semiconductor junctions 122, 123, the capacitive sensing probe 102 will sense a capacitance equal to $C_{pkg}$. This is because the current flowing through the diodes 122, 123 is negligible. The current through the diodes will increase as the stimulus voltage approaches the diode knee voltage. Some of the diode current will flow to the capacitive sensing probe 102 through capacitive coupling $C_{die}$ between the die 113 and the sensor plate 103, and some will flow through the resistance $R_b$ 121 back to ground. The resistance $R_b$ 121 may comprise bulk die, interconnect, etc. The capacitance $C_{die}$ is the capacitance formed between the sensor plate 103 and the metal interconnect on the other side of the diode. Its value will depend on the amount of current flowing through its AC impedance.

Figure 7:
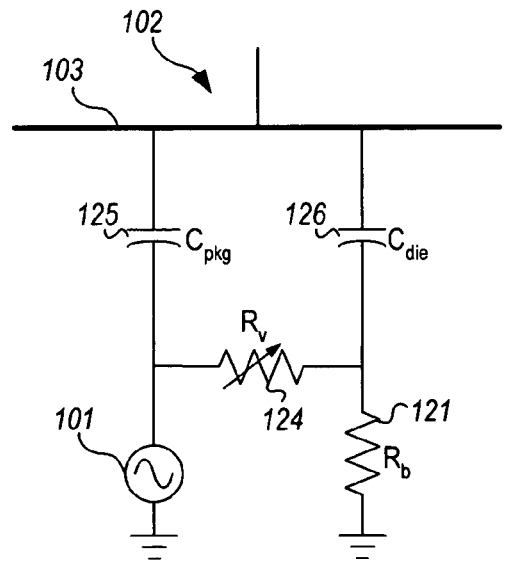
FIG. 7 is a schematic diagram of an equivalent circuit of the system of FIG. 6.

An equivalent circuit for the measurement system of FIG. 6 is shown in FIG. 7. The diode 122, 123 has been replaced with a variable resistance $R_v$ 124 because the diode (speaking in the singular since only one diode 122, 123 can be "on" at any given time) really represents a dynamic resistance to the circuit—that is, as the stimulus voltage increases, the diode current increases faster and therefore causes the dynamic resistance to decrease non-linearly with voltage. The effective capacitance picked up at the sensor plate 103 is represented by:

$$Ceff = \frac{1}{Z_{pkg}} + \frac{1}{Z_{die}}\left(\frac{R_B \| Z_{die}}{(R_B \| Z_{die}) + R_V}\right). \quad \text{Equation (2)}$$

Figure 8:
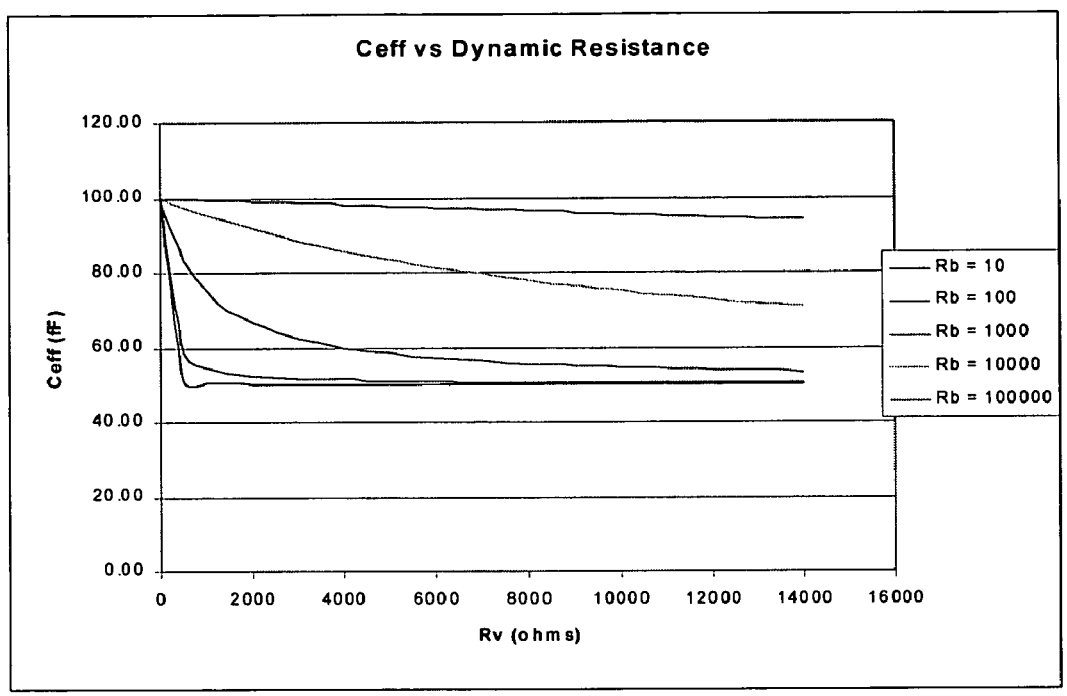
FIG. 8 is a graph illustrating effective capacitance versus simulated variable resistance of the active diode in FIGS. 6 and 7 for several values of bulk resistance.

Simulation results for the equivalent circuit are presented in FIG. 8.

The results of FIG. 8 are shown for a simulation where $C_{pkg}=C_{die}=50$ fF. $R_v$ will decrease as the diode conducts more current. The data confirms that capacitance is largest in the region where $R_v$ is the smallest. The family of curves for different values of $R_b$ indicates that larger bulk resistances will result in higher capacitance readings for a given diode current.

Figure 9:
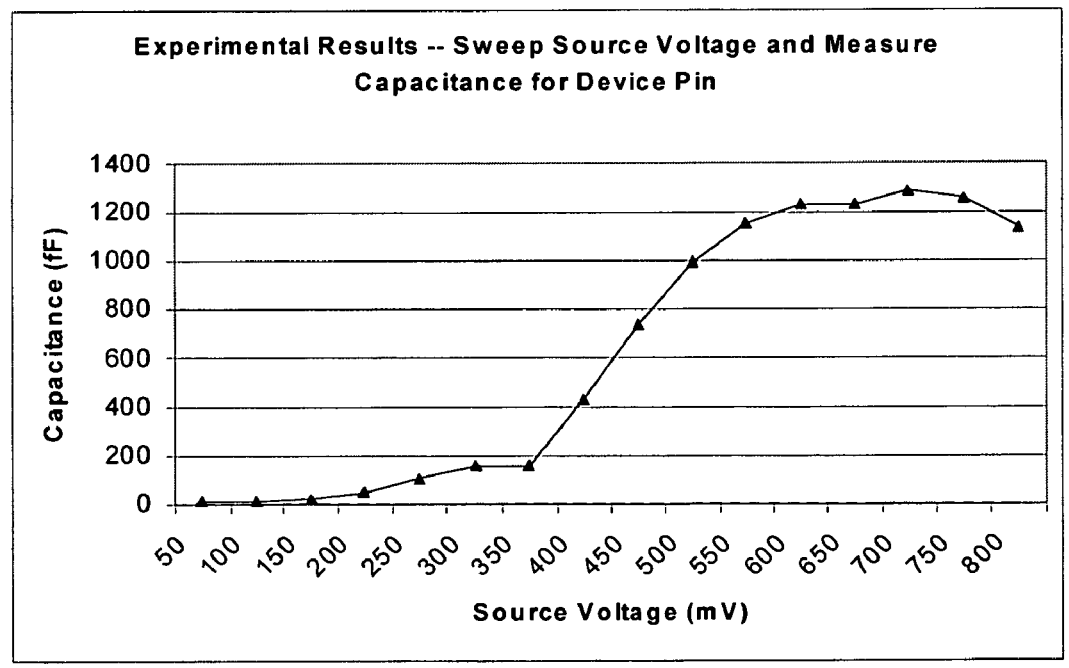
FIG. 9 is a graph illustrating experimental results of capacitance versus stimulus voltage measured on a node of a PCB that is connected to a pin of an IC component mounted on the PCB.

The simulation results have been confirmed by actual capacitive leadframe testing on multiple pins on several actual devices. FIG. 9 shows a capacitance-voltage (CV) curve representing the results for one particular pin when the sensor plate 103 of the capacitive sensing probe 102 is used to measure device capacitance as the voltage is swept. The results of FIG. 9 and the preceding discussion are important for two reasons: (1) Although the capacitance-voltage (CV) curve for the specific device pin does not look like the traditional IV curve of FIG. 2, the results can still be used to confirm the presence of current in semiconductor junctions because the measured effective capacitance is a result of current flowing through the AC impedance of $C_{pkg}$ and $C_{die}$; and (2) results are specific to the semiconductor junction(s) in the IC component coupled to the sensor plate. Unlike the traditional IV curve method, the CV results are unaffected by other IC components (with their own semiconductor) on the same node.

Figure 2:
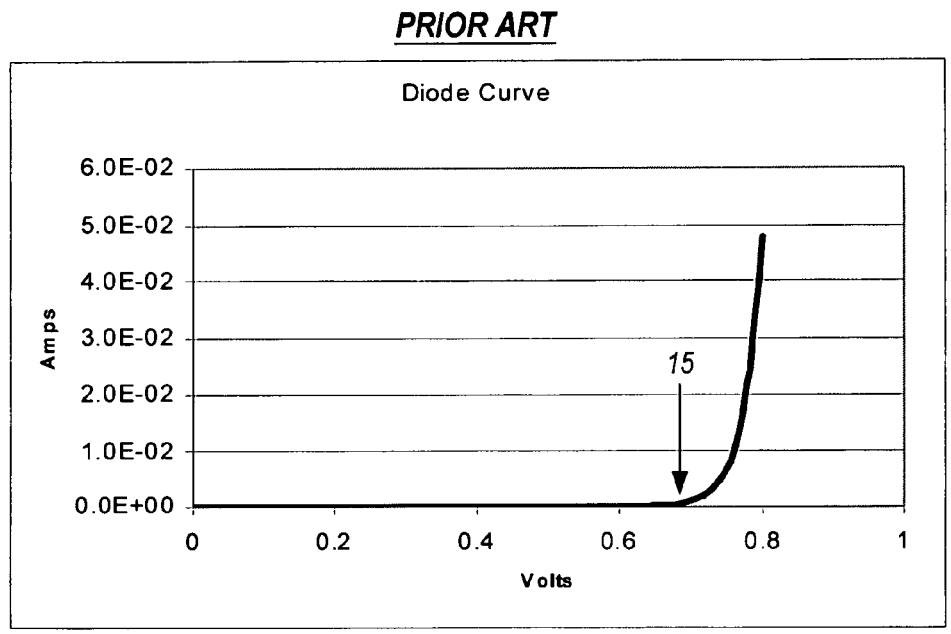
FIG. 2 is a graph illustrating the current-voltage (IV) relationship of the circuit of FIG. 1.
Figure 3:
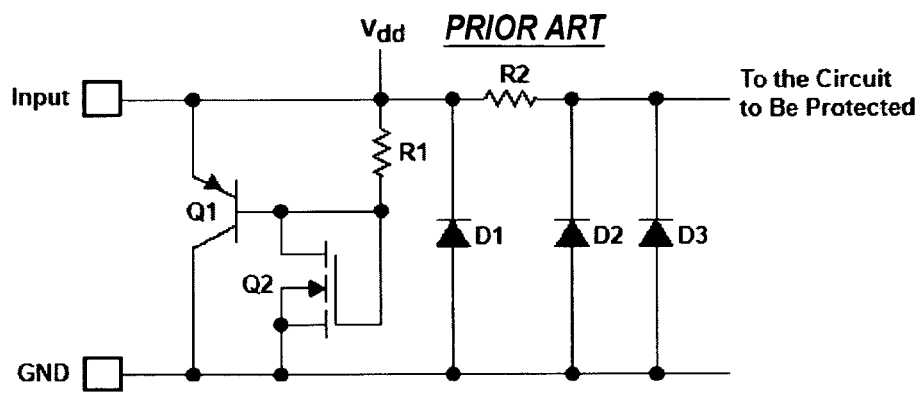
FIG. 3 is a schematic diagram of a prior art two-stage ESD protection circuit.
Figure 10:
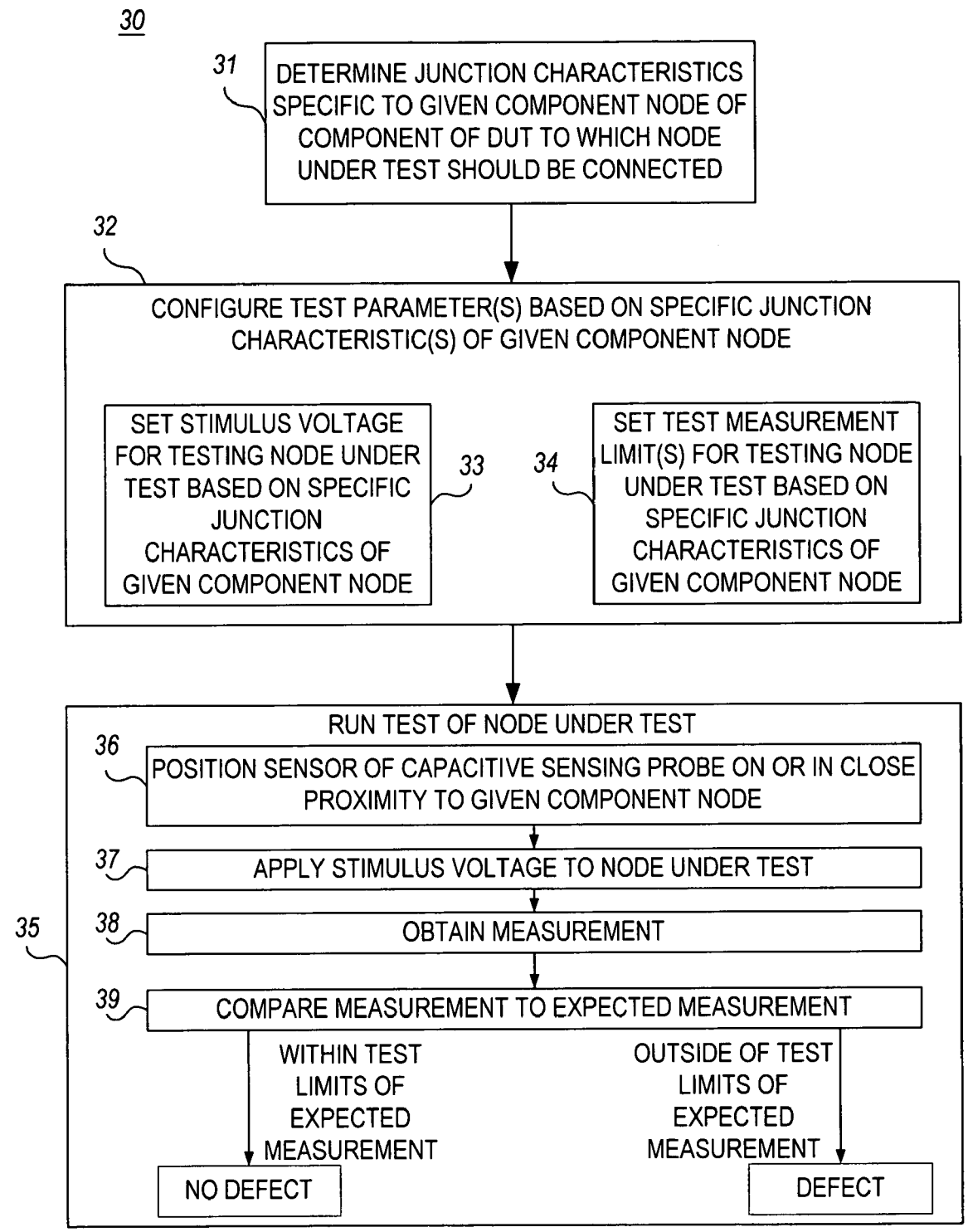
FIG. 10 is a flowchart illustrating a method in accordance with the invention for configuring continuity test parameters of a capacitive lead-frame test of a device under test.

The observed behavior and conclusions drawn therefrom are used in the present invention to configure capacitive leadframe test parameters 109 (FIG. 6) and to determine the presence or non-presence of electrical defects on nodes of a device under test (DUT). FIG. 10 shows the general method 30 of the invention (implemented preferably as part of the test software 108) for configuring capacitive leadframe test parameters 109 for a capacitive lead-frame test of a node under test 130 of a DUT 105. In general, to configure capacitive lead-frame test parameter(s) 109 (FIG. 6) for a node under test on the DUT 105 that is supposed to be connected to a given component node of a component of the DUT, the method 30 includes determining the semiconductor junction characteristics specific to the given component node (step 31). One or more parameters 109 of the test are set based on the semiconductor junction characteristics specific to the given component node (step 32). For example, the value of the stimulus voltage 109a (FIG. 6) to be applied to the node under test during test may be set based on the semiconductor junction characteristics of the given component node (step 33). For example, assume for purposes of this example that the FIG. 2 and FIG. 9 are the IV and CV curves, respectively, resulting from real measurements obtained from the same component node (e.g., the same pin of an IC component). The stimulus voltage 109a (FIG. 6) specific to a given node under test may be set to a value whereby the capacitance value corresponding to the stimulus voltage on the component node that the node under test is supposed to be connected to is relatively high (i.e., measurable by the tester 106) but that will not generate enough current flow to risk damaging the device. The value of current flow may be, for example, less than the amount of current that would place the semiconductor junction in the saturation region, or may be higher to intentionally place the semiconductor junction into the saturation region but at a current level known to be below the maximum safe current flow for the junction (for example, as determined from the fabrication process parameters).

As another example, expected measurement test limit(s) 109b such as limit(s) for expected current and/or expected capacitance that are specific to the semiconductor junction characteristics of the given component node can be set (step 34). The test limit(s) are preferably set to be in a region of the capacitance-voltage (CV) curve where the effective capacitance is insensitive (or less sensitive) to differences in temperature or stimulus voltage. For example, referring to the CV curve in FIG. 9, the stimulus voltage values in the range between 25 mV and 375 mV is less sensitive to changes in stimulus voltage than stimulus voltage values in the range between 375 mV and 550 mV.

Once test configuration parameters are set based on the specific junction characteristics of the given component node, the capacitive leadframe test may be run (step 35).

Figure 11:
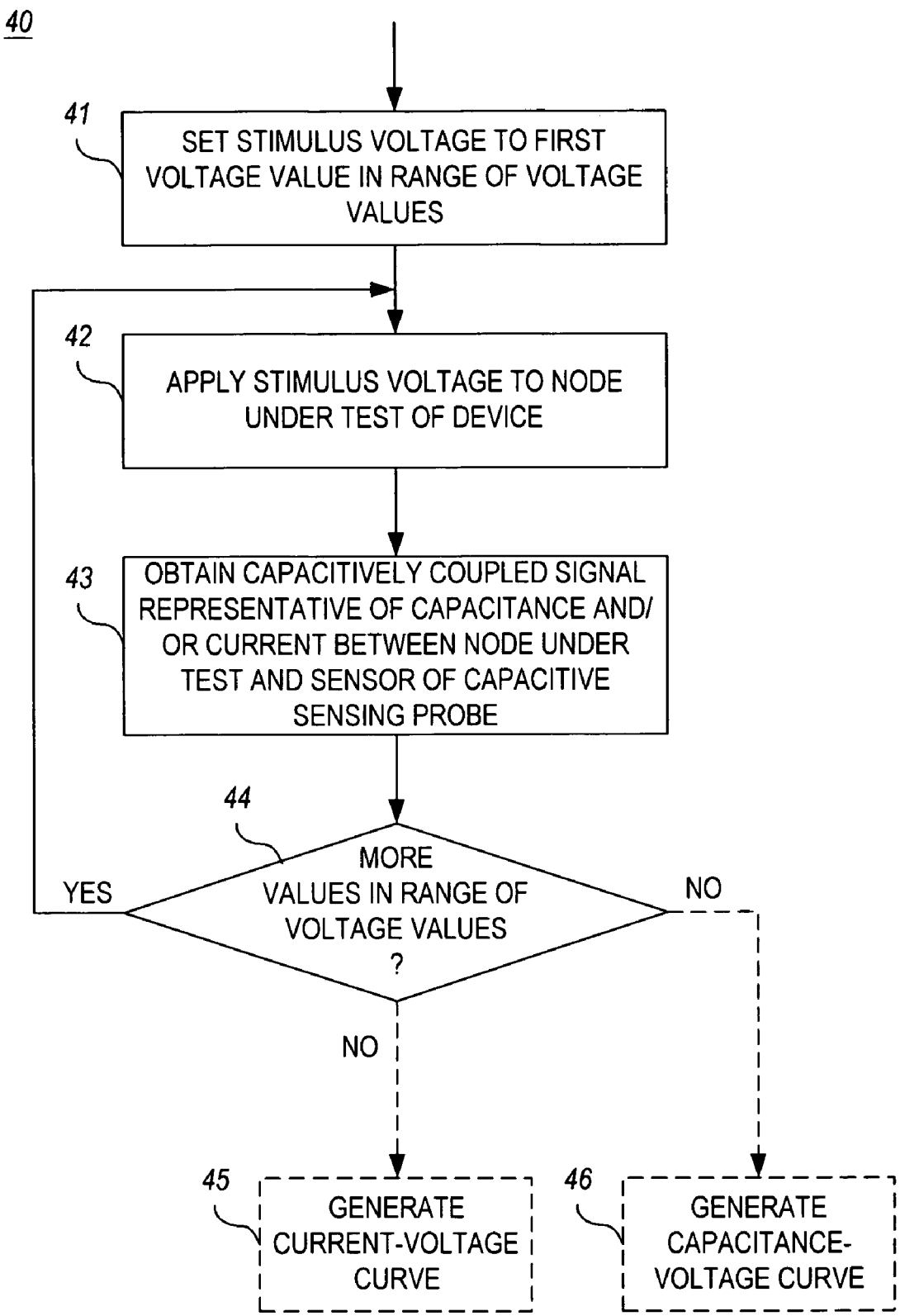
FIG. 11 is a flowchart of a method in accordance with the invention for determining semiconductor junction characteristics specific to a node of a component of a DUT.

FIG. 11 shows the general technique 40 of the invention for determining semiconductor junction characteristics specific to a given component node of a component of a DUT. Generally, measurements representative of the capacitance between the node under test and plate of the capacitive sensing probe are obtained for a number of values of the input source voltage within a predetermined source voltage range. In the preferred embodiment, the input source voltage is swept from below the diode knee to above the diode knee, and corresponding measurements representative of the measured capacitance are obtained. In the particular embodiment shown, the technique 40 sets the stimulus voltage to the first (e.g., lowest) value in a predetermined range of stimulus voltage values (step 41). In the preferred embodiment, the range of stimulus voltage values ranges from below the knee to above the knee of the diode curve of the semiconductor junction(s) connected to the node of the component. The selected stimulus voltage is applied to the node under test of the DUT (step 42). A measurement representative of the capacitance and/or current flow that is capacitively coupled between the node under test and the node of the component is then obtained (step 43). The next voltage value in the range of stimulus voltages is then selected (step 44), and the process (steps 42 through 44) is repeated until measurements corresponding to all values of the stimulus voltage have been obtained. Configuration parameters for testing a node under test that is supposed to be connected to the given component node may then be determined and/or calculated from the collected junction characteristics measurements (collected in steps 41 through 44) (per the method 30 of FIG. 10). Optionally, and preferably, however, a current-voltage (IV) curve and/or a capacitance-voltage (CV) curve are plotted in respective steps 45 and 46. The IV curve and/or CV curve allows the test software 108 to more easily determine the location of the diode knee, and regions of capacitive sensitivity and insensitivity specific to the given component node.

Figure 12:
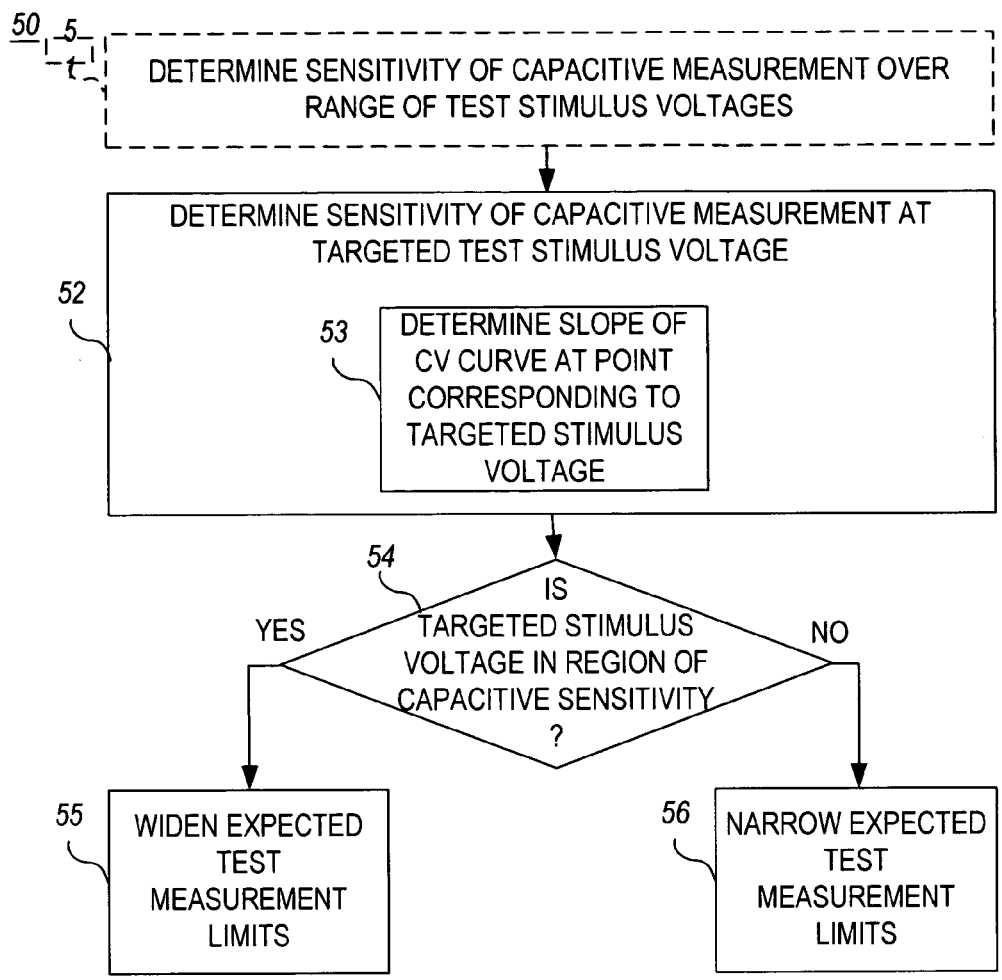
FIG. 12 is a flowchart of a method in accordance with the invention for optimizing the test measurement limit(s) for testing the node under test that is supposed to be connected to the node of the component.

FIG. 12 illustrates the general technique 50 for optimizing the test measurement limit(s) for testing the node under test that is supposed to be connected to the given component node of the component of the DUT. As shown, the sensitivity of the capacitive measurement over a range of test stimulus voltages is determined based on the specific semiconductor junction characteristics of the given component node (step 51). The sensitivity can be determined, for example, from a CV curve specific to the semiconductor junction of the given component node. In this regard, regions of low sensitivity correspond to flat areas (zero slope) of the CV curve and regions of high sensitivity correspond to areas of the CV curve characterized by a non-zero slope (i.e., the capacitance changes significantly with small changes in stimulus voltage). The sensitivity of the capacitive measurement at the targeted test stimulus voltage is determined based on the specific semiconductor junction characteristics of the given component node (step 52). In a preferred embodiment, the test software 108 generates the CV curve using the obtained measurements or derivatives thereof as the data points in the curve. For example, after generating a CV curve for the given component node, the test software 108 can determine the sensitivity of a capacitive measurement on the given component node at the targeted stimulus voltage from the slope of the curve at the point on the curve corresponding to the targeted stimulus voltage (step 53).

If the targeted stimulus voltage is in a region of capacitive sensitivity (determined in step 54), then the targeted test stimulus voltage must be approaching the forward conducting knee of a semiconductor junction IV curve since capacitance and current are directly related. The node of the component will therefore likely exhibit an increased sensitivity to temperature because the internal semiconductor junctions are conducting more current. (Note: a temperature differential would be evident, for example, if the test limits are set during test debug at a temperature that is different than the production testing temperature.) Given the information regarding the given component node's capacitive sensitivity at the targeted test stimulus voltage, the test software 108 may widen the expected test measurement limit(s) (step 55) to avoid false diagnostic failures due to conditions such as temperature differentials. If the node's capacitive sensitivity is low (i.e., the capacitance changes very little with small changes in stimulus voltage), the test software 108 may narrow the expected test measurement limit(s) (step 56) to ensure more accuracy.

The method 50 of FIG. 12 can be performed for all nodes under test prior to running any tests. Alternatively, for example to save pre-test execution time, the method 50 can be performed only for those nodes under test that initially fail a first pass of the test, wherein the first pass of the test comprises running the test using a predetermined universal stimulus voltage value for all nodes under test. The measurement sensitivity determined from the CV curve corresponding to the "failed" node under test can be used to adjust the stimulus voltage in order to increase the capacitance measurement readings to therefore gain test coverage on nodes under test whose first-pass reading of the measured capacitance value was too low (i.e., not within the test limits).

Clearly, the test measurement limit(s) can also be optimized for each node under test of a device by optimizing the test voltage stimulus. As described above, measurement signal-to-noise ratio (SNR) is improved by increasing the measured capacitance value in higher proportion to any resulting increase in noise. Prior art test systems have always stayed below a certain predetermined stimulus voltage level as a default rule for all nodes of the DUT. Knowledge of the junction characteristics, for example by way of the IV and/or CV curve, of each component node of a component that is supposed to be connected to a node under test of the DUT allows the test software 108 to maximize the stimulus voltage signal 101 while also staying in a region of temperature and voltage insensitivity to prevent the semiconductor junction(s) from turning on.

Figure 13:
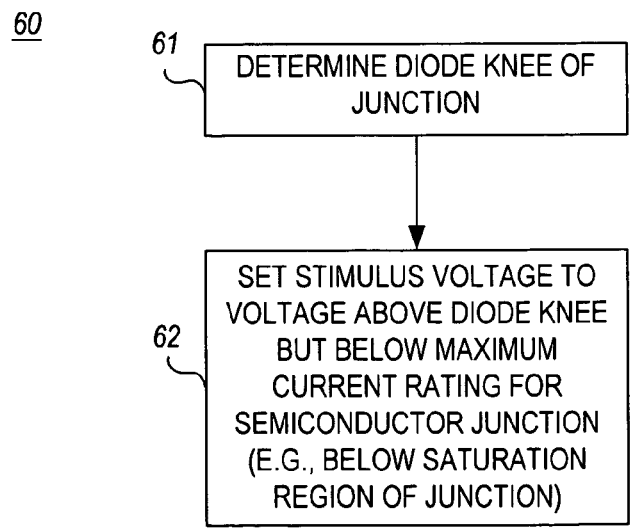
FIG. 13 is a flowchart of a method in accordance with the invention for optimizing the targeted stimulus voltage to be applied during test of the node under test that is supposed to be connected to the node of the component.

Alternatively, or in addition to optimizing the expected test measurement limits, the test software 108 may also adjust or optimize the targeted stimulus voltage based on the semiconductor junction characteristics of the given component node in order to improve or maximize the measurement signal-to-noise ratio (SNR) by increasing the measured capacitance value to allow the test system to detect the change in capacitance in spite of high background noise. FIG. 13 illustrates a method 60 for optimizing the targeted stimulus voltage to be applied during test of the node under test that is supposed to be connected to the given component node of the component of the DUT. As a rule, the idea is to turn on the semiconductor junction enough to achieve sufficient capacitive coupling of current through the given component node to the sensor plate of the capacitive sensing probe without actually fully turning on the semiconductor junction(s) enough to risk damage to the internal circuitry. Accordingly, the idea is to be above the knee of the diode curve in order to achieve sufficient current flow for detection by the tester, but well below the maximum junction current limit (for example, by selecting a current level below the saturation region of the junction) to ensure that the current flow does not damage the internal circuitry of the component of the DUT. In the method 60, the knee of the diode curve specific to the semiconductor junction is determined based on the specific semiconductor junction characteristics of the given component node (step 61). In a preferred embodiment, the test software 108 generates the IV curve using the obtained measurements or derivatives thereof as the data points in the curve. For example, after generating the IV curve for a specific node of the component, the test software can determine the knee region of the IV curve as that portion of the curve that begins to significantly increase in current.

Once the diode knee of the semiconductor junction(s) on the node of the component is known, the test stimulus voltage for nodes connected to the node of the component is set to a value above the diode knee but below the maximum current limit of the semiconductor junction(s) connected to the node (step 62).

Figure 14:
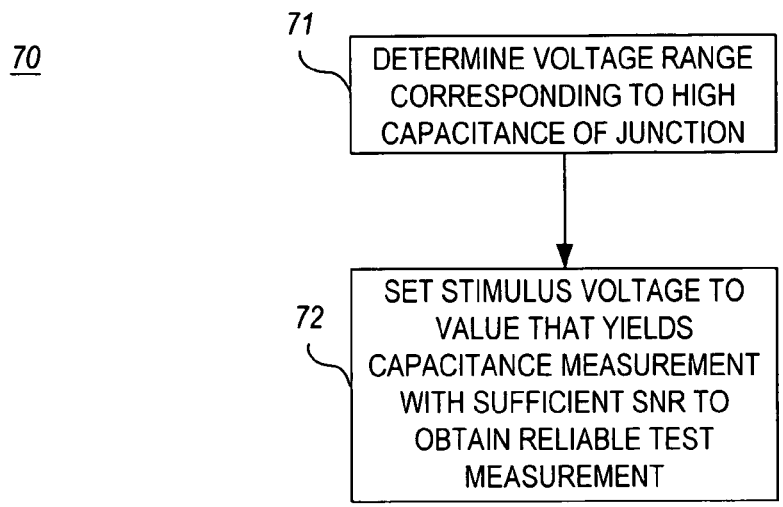
FIG. 14 is a flowchart illustrating an alternative method for optimizing the targeted stimulus voltage to be applied during test of the node under test that is supposed to be connected to the node of the component.

FIG. 14 illustrates an alternative method 70 for optimizing the targeted stimulus voltage to be applied during test of the node under test that is supposed to be connected to the node of the component. In this method 70, the voltage range corresponding to relatively high capacitance measurements is determined based on the specific semiconductor junction characteristics of the given component node (step 71). In a preferred embodiment, the test software 108 generates the capacitance-voltage (CV) curve using the obtained measurements or derivatives thereof as the data points in the curve. For example, after generating the CV curve for a specific node of the component, the test software 108 can determine the portion of the CV curve where the capacitance is high relative to other portions of the curve. For example, referring to FIG. 9, in a stimulus voltage range above 375 mV, the capacitance of the component node is high relative to the capacitance corresponding to a stimulus voltage range below 375 mV.

Once the stimulus voltage values that result in high relative capacitance on the node of the component are known, the test stimulus voltage 109a for a node under test that is supposed to be connected to the given component node of the component of the DUT is set to one of these stimulus voltage values that would yield a capacitance reading with sufficient signal-to-noise ratio (SNR) for the measurement and preferably no more than what is considered sufficient to obtain an accurate measurement without false failures or false non-failures (step 72).

Figure 15:
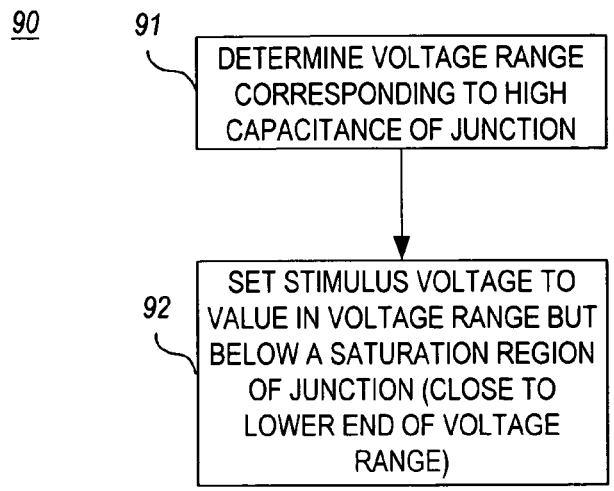
FIG. 15 is a flowchart illustrating an alternative method for optimizing the targeted stimulus voltage to be applied during test of the node under test that is supposed to be connected to the node of the component.

FIG. 15 illustrates an alternative method 90 for optimizing the targeted stimulus voltage to be applied during test of the node under test that is supposed to be connected to the node of the component. In this method 90, the voltage range corresponding to relatively high capacitance measurements is determined based on the specific semiconductor junction characteristics of the given component node (step 91). In a preferred embodiment, the test software 108 generates the capacitance-voltage (CV) curve using the obtained measurements or derivatives thereof as the data points in the curve. Once the range of stimulus voltage values that result in high relative capacitance on the node of the component are known, the test stimulus voltage for a node under test that is supposed to be connected to the given component node of the component of the DUT is set to one of the stimulus voltage values in the range but that is below the saturation region of the junction(s) (preferably towards the lower end of the stimulus voltage range that corresponds to relatively high capacitance on the CV curve) (step 92).

Figure 16:
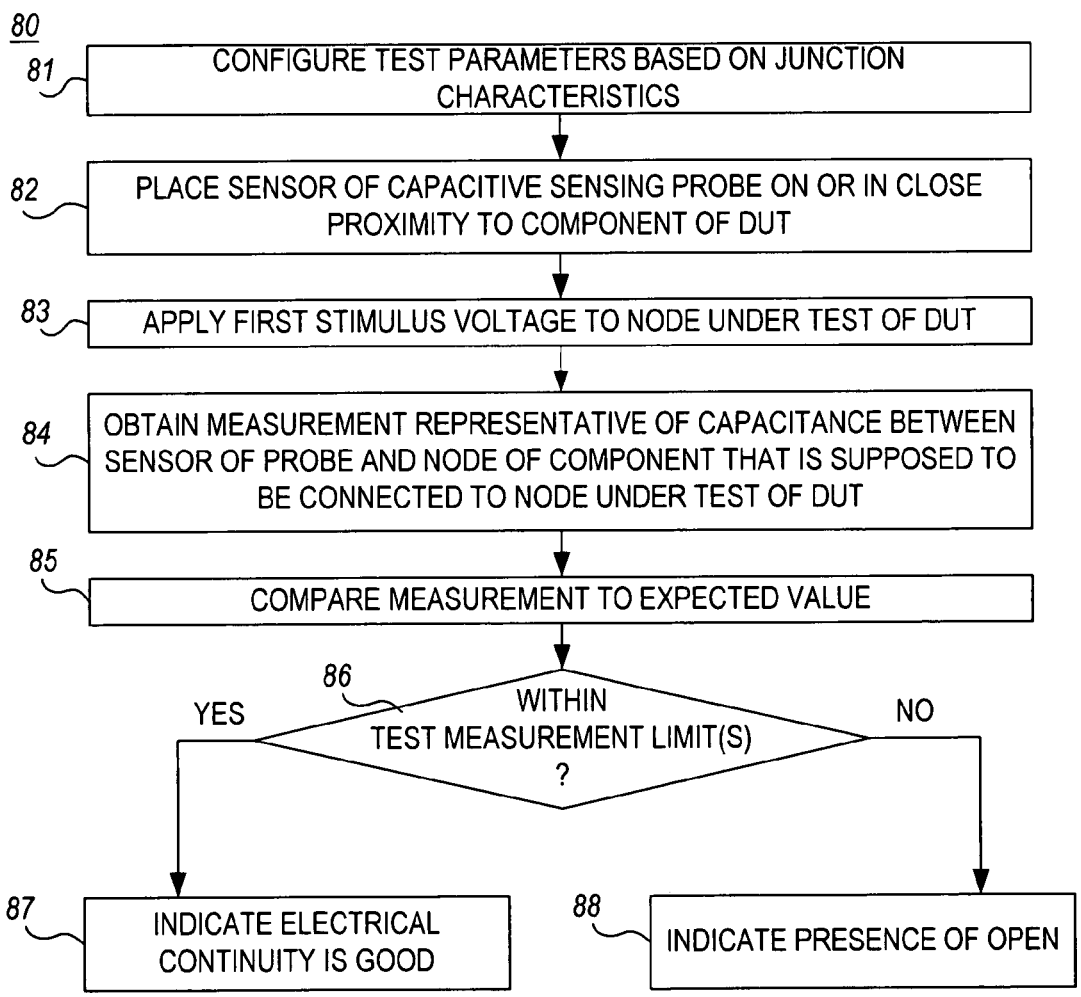
FIG. 16 is a flowchart of a method in accordance with the invention for running a capacitive leadframe test.

FIG. 16 illustrates the general method 80 of the invention for running a capacitive leadframe test. As illustrated, to run a capacitive leadframe test, test parameters are configured based on semiconductor junction characteristics of nodes of the components to which nodes under test of the DUT are supposed to be connected (step 81). The sensor of a capacitive sensing probe is placed on or in proximity to a component of the DUT (step 82), the component having a given component node to which the node under test of the DUT is supposed to be connected. A stimulus voltage (for example, as determined from specific semiconductor junction characteristics of the component node of the component) assigned to the node under test is then applied to a node under test of the DUT (step 83). A measurement is obtained representing the capacitance between the component and the sensor of the capacitive sensing probe (step 84). The obtained measurement or a derivative thereof is compared to an expected value and/or a range of expected values as defined by expected test measurement limits (step 85). If the obtained measurement or derivative thereof matches the expected value or is within the expected test measurement limits (as determined in step 86), then the electrical continuity of the path between the node under test on the DUT and the given component node is intact, and such indication is made (step 87).

If the obtained measurement or derivative thereof does not match or is not within the expected test measurement limits, an open connection (or short or other defect) may be indicated (step 88).

Testing for certain defects of nodes under test can optionally be improved with knowledge of the specific semiconductor junction characteristics (for example, the individual CV curves) of each of the component nodes to which nodes under test are supposed to be connected. Rather than looking for a drop in measured capacitance to determine that an open is present, as in the traditional capacitive leadframe test, the drop in capacitance can be tested at more than one stimulus voltage. Since the drop in capacitance is created by the addition of a small series capacitance in place of a connection, sometimes the difference between a good test capacitance value and the capacitance value indicating a defect is small because of device geometry and/or the actual value of the capacitive open. The small difference can lead to ambiguity in test diagnostics, and may therefore result in high incidences of false failures and/or false non-failures. Diagnostic software can improve the check for an open by making two (or more) measurements at different points on the CV curve with a wide separation in measured capacitances. The difference between a good and an open value is increased because of the added capacitance when device semiconductor junctions are conducting current. This step might be employed only after a standard single measurement test has failed as a method of confirming the failure. This would allow the test software to set tighter test limits to detect more opens without increasing the false failure and/or false non-failure rate.

Figure 17:
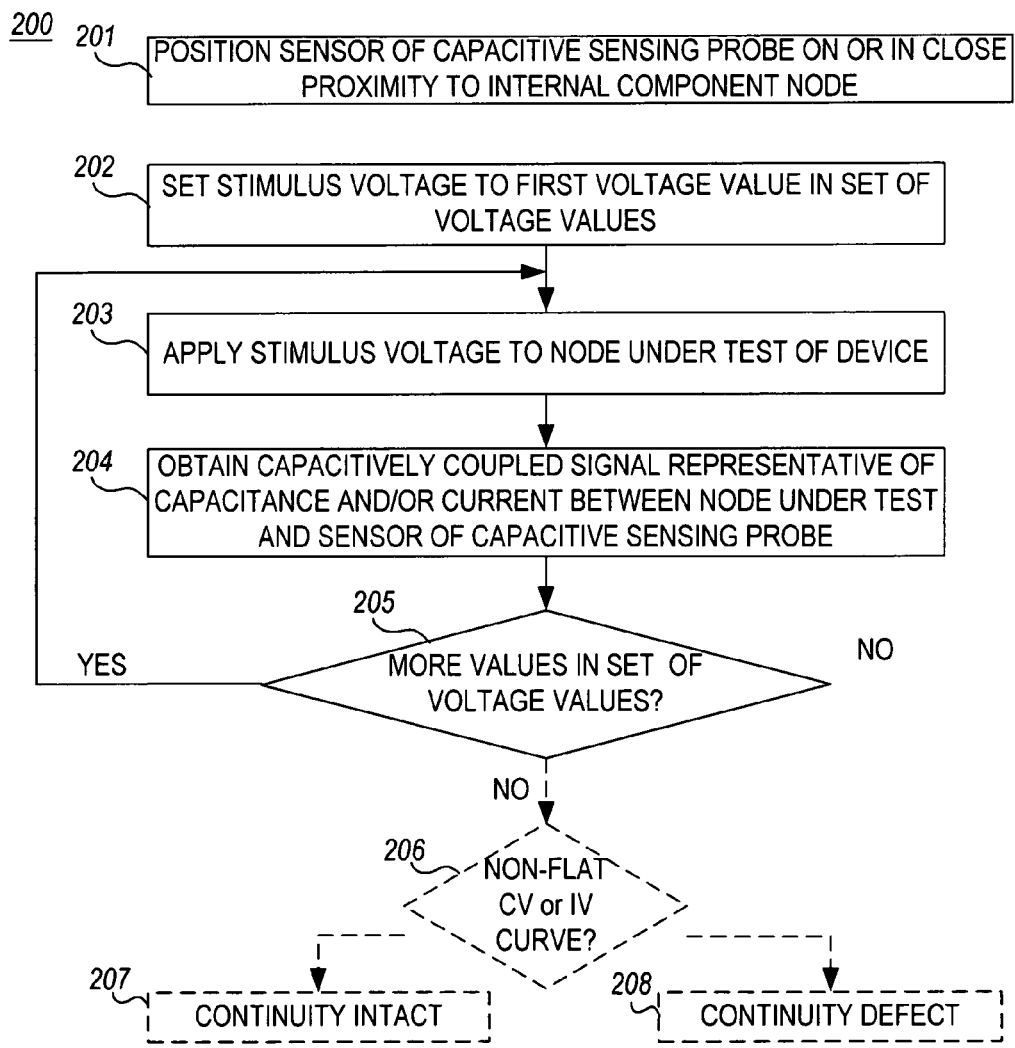
FIG. 17 is a flowchart of a method for detecting whether an open defect exists along an electrical path between a node under test of a DUT and an internal node of a component mounted on the DUT.

Depending on whether the measured capacitance increases or not, various characteristics of the node or joint can be concluded. For example, a non-flat CV curve confirms the presence of current in semiconductor junctions for the pin in the device under test. This implies that all connections from the tester to the pin semiconductor junctions in the device die are good. These connections not only include the device package to PCB connection (i.e, the "joint") which is the normal target of capacitive lead-frame testing, but also the bondwire 116 connection between the leadframe 112 and the die internal to the device. This fact increases the diagnostic coverage of the test software 108. FIG. 17 shows a method 200 for detecting an open defect on an electrical path between a node under test (for example an electrical contact pad or trace on a PCB or a pin of an IC) and an internal node of a component mounted on the PCB (for example, a node on the die of the IC) to ensure the electrical integrity of all points in the path between the node under test and the internal component node (for example to ensure that the bondwire 116 is properly connected to both the internal node of the component and the component package leadframe 112, and that the pin is properly connected between the component package leadframe 112 and node on the PCB). As illustrated, the method 200 comprises the steps of: positioning a sensor of a capacitive sensing probe only over the component containing the internal component node (step 201); setting the stimulus voltage to a first value in a set of voltage values (step 202), applying the stimulus voltage to the node under test of the device (step 203); obtaining a capacitively coupled signal representative of the capacitance and/or current between the internal component node and the sensor of the capacitive sensing probe (step 204); repeating the process for at least one additional stimulus voltage value in the set of voltage values, wherein at least one obtained measurement corresponds to a stimulus voltage value below the diode knee of the internal component node and at least one of the obtained measurements corresponds to a stimulus voltage value above the diode knee (but below the maximum current limit) of the internal component node (step 205, followed by steps 202 through 205); determining whether the capacitance-voltage (CV) curve and/or current-voltage (IV) curve represented by the obtained measurements is non-flat (i.e., the curve(s) exhibit an increase in capacitance and/or current (step 206); and if the curve(s) exhibit an increase in capacitance and/or current, indicating that the continuity of the electrical path between the node under test and the internal component node is intact (step 207), or if the curve(s) do not exhibit an increase in capacitance and/or current, indicating that a continuity defect exists along the electrical path between the node under test and the internal component node (208). The method 200 of FIG. 17 can be used not only to determine the electrical continuity between the connection of an IC pin or pad to a substrate or PCB, but also to determine the electrical continuity along the entire path between the pin, leadframe, bondwire, and internal node of the IC component. Furthermore, the electrical continuity can be obtained using this method in as few as two measurements if the stimulus voltage values are intelligently selected to include measurements expected to result in a wide difference in capacitance readings, such as selecting stimulus voltage values that include one stimulus voltage value below the diode knee of the internal node junction and one stimulus voltage value above the diode knee of the internal node junction.

Furthermore, because the sensing is done via capacitance to a sensing plate which is placed only on this specific device, the increased capacitance observed due to varying the stimulus voltage can only be due to coupling through this specific device. Thus it eliminates the possibility that the other devices connected to the node are contributing to the measurement value, thereby eliminating one source of error and giving more dependable results.

Therefore, if the measured capacitance increases, test software 108 can be configured to conclude that the integrity of the node or joint is good (i.e., no open exists), while conversely, if the measured capacitance does not increase, one can conclude that the integrity of the node or joint is bad (i.e., an open exists).

Current test development techniques require a known-good board (KGB) for the debug phase of tests. During debug, the software makes measurements of the devices to be tested and sets test limits based on the measurements. However, the creation of a known-good board can be problematic since each node under test must be tested and determined to be good within predicted test limits. However, current test software techniques do not include any way of predicting what the known good test value should be, so it is unknown during debug whether a specific node under test is good. If some defects are present in the KGB, the test software may set limits incorrectly or needlessly determine that some pins are untestable due to the SNR of the measurement signal relative to system noise. The present invention eliminates this limitation by designing the test software to look for the presence of voltage sensitive measurements in the CV curve of the node under test and then set the test limits and/or stimulus voltage accordingly. As discussed previously, voltage sensitive measurements are detectable from the CV curve since the CV curve will show measurement changes as semiconductor junctions turn on and conducts more current.

Those of skill in the art will appreciate that the invented method and apparatus described and illustrated herein may be implemented in software, firmware or hardware, or any suitable combination thereof. Preferably, the method and apparatus are implemented in software, for purposes of low cost and flexibility. Thus, those of skill in the art will appreciate that the method and apparatus of the invention may be implemented by a computer or microprocessor process in which instructions are executed, the instructions being stored for execution on a computer-readable medium and being executed by any suitable instruction processor. Alternative embodiments are contemplated, however, and are within the spirit and scope of the invention.

Although this preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for determining electrical continuity along an electrical path between a node under test of an electrical device and an internal component node of a component mounted on the electrical device, the method comprising the steps of:

positioning a sensor of a capacitive sensing probe only over the component containing the internal component node;

setting a stimulus voltage to a value in a set of voltage values, the set of voltage values determined based on semiconductor junction turn-on characteristics specific to the internal component node of the component and ranging from below to above a knee of a corresponding diode curve of the internal component node;

applying the stimulus voltage to the node under test of the device;

obtaining a capacitively coupled signal measurement representative of the capacitance and/or current between the internal component node and the sensor of the capacitive sensing probe;

repeating the setting step through the obtaining step for at least one additional stimulus voltage value in the set of voltage values, wherein at least one obtained measurement corresponds to a stimulus voltage value below the knee of the corresponding diode curve and at least one obtained measurement corresponds to a stimulus voltage value above the knee of the corresponding diode curve;

determining whether a capacitance-voltage (CV) curve and/or a current-voltage (IV) curve represented by the obtained capacitively coupled signal measurements is non-flat; and if the capacitance-voltage (CV) curve and/or the current-voltage (IV) curve exhibits an increase in capacitance and/or current, indicating that the electrical continuity along the electrical path between the node under test of the electrical device and an internal component node of the component is intact, or if the capacitance-voltage (CV) curve and/or the current-voltage (IV) curve does not exhibit an increase in capacitance and/or current, indicating that the electrical continuity along the electrical path between the node under test of the electrical device and an internal component node of the component is defective.

* * * * *